United States Patent
Fujita et al.

(10) Patent No.: US 9,784,369 B2
(45) Date of Patent: Oct. 10, 2017

(54) COMBINATION OIL RING

(71) Applicant: TPR CO., LTD., Chiyoda-ku, Tokyo (JP)

(72) Inventors: Hironori Fujita, Tokyo (JP); Kentaro Kawano, Tokyo (JP)

(73) Assignee: TPR CO., LTD., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/034,657

(22) PCT Filed: Mar. 30, 2015

(86) PCT No.: PCT/JP2015/059962
§ 371 (c)(1),
(2) Date: May 5, 2016

(87) PCT Pub. No.: WO2016/038916
PCT Pub. Date: Mar. 17, 2016

(65) Prior Publication Data
US 2017/0175893 A1 Jun. 22, 2017

(30) Foreign Application Priority Data
Sep. 12, 2014 (JP) .................................. 2014-185940

(51) Int. Cl.
*F16J 9/20* (2006.01)
*F16J 9/26* (2006.01)
(Continued)

(52) U.S. Cl.
CPC .................. *F16J 9/20* (2013.01); *F16J 9/064* (2013.01); *F16J 9/203* (2013.01); *F16J 9/26* (2013.01);
(Continued)

(58) Field of Classification Search
CPC .... F16J 9/064; F16J 9/066; F16J 9/068; F16J 9/20; F16J 9/203; F16J 9/206; F16J 9/26
See application file for complete search history.

(56) References Cited

U.S. PATENT DOCUMENTS 2,614,899 A * 10/1952 Phillips .................... F16J 9/063
277/444
2,712,971 A * 7/1955 Phillips .................... F16J 9/067
277/444
(Continued)

FOREIGN PATENT DOCUMENTS

CN 1494641 A 5/2004
CN 1708656 A 12/2005
(Continued)

OTHER PUBLICATIONS

Japanese Notification of Reason for Refusal corresponding to Patent Application No. 2015-516329; Dispatch Date: Jun. 16, 2015, with English translation.
(Continued)

*Primary Examiner* — Nicholas L Foster
(74) *Attorney, Agent, or Firm* — Cantor Colburn LLP

(57) ABSTRACT

In a combination oil ring, when a line passing through a center of a segment width is a first intermediate line, a length of a line segment between a position on an engine combustion chamber side and a position on a side distant from the engine combustion chamber on a contour curve at a position at a distance of 3 μm from an outer peripheral vertex toward an inner peripheral side in a segment radial direction is L, and an intermediate line of the line segment L is a second intermediate line, the second intermediate line is located on the side more distant from the engine combustion chamber than the first intermediate line, and the outer periphery vertex of the segment is located on the second intermediate
(Continued)

line or on the side more distant from the engine combustion chamber than the second intermediate line.

6 Claims, 9 Drawing Sheets

(51) Int. Cl.
 *F16J 9/06* (2006.01)
 *C23C 14/06* (2006.01)
 *C23C 14/32* (2006.01)
(52) U.S. Cl.
 CPC ...... *C23C 14/0611* (2013.01); *C23C 14/0641* (2013.01); *C23C 14/325* (2013.01); *F16J 9/066* (2013.01); *F16J 9/067* (2013.01); *F16J 9/068* (2013.01)

(56) References Cited

U.S. PATENT DOCUMENTS

| | | | |
|---|---|---|---|
| 5,820,131 A | 10/1998 | Tanaka et al. | |
| 7,077,402 B2 | 7/2006 | Katumaru et al. | |
| 7,306,232 B2 | 12/2007 | Fiedler et al. | |
| 7,354,045 B2* | 4/2008 | Abe | F16J 9/062 277/435 |
| 8,371,585 B2* | 2/2013 | Esser | F16J 9/20 277/434 |
| 8,973,262 B2* | 3/2015 | Esser | B23P 15/06 29/888.07 |
| 9,638,321 B2* | 5/2017 | Meyer | F16J 9/203 |
| 2004/0061291 A1 | 4/2004 | Takiguchi | |
| 2006/0006604 A1* | 1/2006 | Abe | F16J 9/062 277/434 |
| 2010/0176557 A1 | 7/2010 | Peter-Klaus et al. | |
| 2011/0100318 A1 | 5/2011 | Higuchi et al. | |
| 2014/0165826 A1* | 6/2014 | Baerenreuter | F16J 9/062 92/172 |
| 2015/0093586 A1 | 4/2015 | Kawai | |
| 2015/0130143 A1* | 5/2015 | Meyer | F16J 9/206 277/442 |

FOREIGN PATENT DOCUMENTS

| | | |
|---|---|---|
| CN | 11403348 | 4/2009 |
| CN | 101680545 A | 3/2010 |
| CN | 104080941 A | 10/2014 |
| DE | 4429649 A1 | 2/1996 |
| FR | 2723401 A1 | 2/1996 |
| JP | S5763951 A | 4/1982 |
| JP | 07239032 | 9/1995 |
| JP | H09210203 A | 8/1997 |
| JP | 2002323133 | 11/2002 |
| JP | 2003049705 | 2/2003 |
| JP | 4322500 A | 9/2009 |
| JP | 2010031835 A | 2/2010 |
| JP | 2010530045 A | 9/2010 |
| JP | 4800946 B2 | 10/2011 |
| JP | 5833276 B1 | 12/2015 |

OTHER PUBLICATIONS

Kazuya Mochizuki et al. "A study on Oil-Ring Conformability to Cylinder Bore (1st Report)" Automotive technology of JSME / automotive technology series, vol. 44, No. 2, 2013, pp. 7-12.
Kei Nakayama, et al. "The Effect of Oil Ring Geometry on Oil Film Thickness in the Circumferential Direction of the cylinder" Society of Automotive Engineers, Inc. 1998, pp. 1-7.
International Search Report corresponding to Application No. PCT/JP2015/059962; Date of Mailing: Jun. 23, 2015, with English translation.
State Intellectual Property Office of People's Republic of China Notification of the First Office Action corresponding to Application No. 201580002991.X; Dated Apr. 18, 2017.

* cited by examiner

COMBINATION OIL RING

CROSS REFERENCE TO RELATED APPLICATIONS

This is a U.S. national stage of application No. PCT/JP2015/059962, filed on Mar. 30, 2015. Priority under 35 U.S.C. §119(a) and 35 U.S.C. §365(b) is claimed from Japanese Patent Applications No. 2014-185940 filed on Sep. 12, 2014, the disclosure of which is also incorporated herein by reference.

TECHNICAL FIELD

The present invention relates to a combination oil ring installed in an oil ring groove of a piston.

BACKGROUND ART

In a piston ring groove provided in the outer periphery of a piston of an internal combustion engine, a piston ring is installed. A configuration of the piston ring in the ordinary gasoline internal combustion engine is composed of two compression rings (a top ring and a second ring) and a combination oil ring. The combination oil ring has an oil control function to suppress the consumption of an engine oil.

As a prior art literatures relating to such an oil ring, the followings are exemplified. PTL 1 discloses, in two discs (side rails) of the oil ring having running surfaces in an asymmetrical convex shape, an oil scraping ring whose vertex lines of the outer peripheral surfaces of the discs being directed in opposite directions toward the middle of the ring groove, and an oil scraping ring whose vertex lines of the outer peripheral surfaces of the discs being directed in the same direction toward the side surface in the opposite direction to the piston top of the ring groove. Further, it is also disclosed that the transverse section of the running surface of the disc is in an asymmetrical shape of a quadratic polynomial expressed by $h(x)=ax+bx^2$ in a first section, and in an asymmetrical shape of a function of $h(x)=cx^2$ in a third section, after a supporting vertex (II)$h(x=0)$ configured as an edge.

Further, PTL 2 discloses a two-piece type combination oil ring having upper and lower rails and an expander. PTL 2 discloses that each of outer peripheral surfaces of the upper and lower rails is formed by an asymmetric barrel curve with a position closer to the lower part in the axial direction from the center of the width in the rail axial direction as a vertex, and the drop in the radial direction on the upper side of the asymmetric barrel curve is preferably 25 to 75 μm and the drop in the radial direction on the lower side of the asymmetric barrel curve is preferably 1 to 20 μm.

Further, NPL 1 discloses a configuration that the outer peripheral surface shape of the segment (side rail) is provided in a symmetrical convex shape in actual operation of a 2-liter 4-cycle gasoline engine. NPL 1 states an oil film thickness on a contour curve of the segment (side rail) when supplying to a test a 3-piece oil ring having a drop from the outer peripheral vertex of a measurement width of 0.15 mm in a slide direction of the segment (side rail) on the order of about 4 μm. It is studied and reported (FIG. 12) that the oil film thickness is about 1 μm to 6 μm in four cycles on a thrust side under a full-load operation condition of 2000 rpm by the LIF (Laser-Induced-Fluorescence) method using fiber. The fact that the oil film thickness increases with an increase in the number of revolutions of the engine is described in the report.

Further, in NPL 2, it is studied and reported (FIG. 10) that the oil film thickness of the 3-piece oil ring (an oil ring D) is about 1 μm to 4 μm in four cycles on the thrust side under an operation condition of 2000 rpm and 75% 1-Load during actual operation of a 0.3-liter single cylinder 4-cycle test diesel engine.

CITATION LIST

Patent Literature

{PTL 1} JP 4800946
{PTL 2} JP 4322500
{NPL 1} Research on Cylinder Bore Following Capability of Oil Ring (First Report) Kazuya MOCHIZUKI et al., Oct. 5, 2012, Society of Automotive Engineers of Japan Autumn Academic Conference Contribution 279-20125735
{NPL 2} The Effect of Oil Ring Geometry on Oil Film Thickness in the Circumferential Direction of the Cylinder Kei Nakayama etc. SAE PAPER 982578

SUMMARY OF INVENTION

Technical Problem

In recent years, to realize reduction of fuel consumption of an engine, the internal combustion is increasingly reduced in tension of an oil ring for the purpose of reducing the friction and is required to have an abrasion resistant coating film with low friction formed at an outer peripheral surface of a segment (side rail). However, the reduction in tension of the oil ring causes a problem of the oil film becoming thicker and the oil consumption increasing, in particular, in a high-speed region where the engine becomes high revolution. Therefore, it is a problem to enable the reduction in oil consumption in the high-speed region even if the oil ring is low in tension.

The present invention has been made based on the above circumstance, and its object is to provide a combination oil ring capable of reducing an oil consumption in a high-speed region where the engine becomes high revolution even if an oil ring tension is low.

Solution to Problem

In order to solve the above problem, according to a first aspect of the present invention, there is provided a combination oil ring installed in an oil ring groove of a piston for an internal combustion engine and including: a pair of segments having outer peripheral surfaces sliding on an inner wall of a cylinder; and an expander spacer arranged between the pair of segments and pressing the outer peripheral surfaces of the pair of segments against the inner wall of the cylinder, wherein:

a shape of the outer peripheral surface in an arbitrary longitudinal section of the segment has, in a radial direction from both end faces forming a segment width toward the inner wall of the cylinder, curved shapes symmetric while forming a pair on an engine combustion chamber side and on a side distant from an engine combustion chamber of the segment width, and the shape of the outer peripheral surface on a side of an outer peripheral vertex in contact with the inner wall when inserted into the cylinder has an asymmetrical shape in the segment width direction across a portion of the outer peripheral vertex, which is a shape continuous to the curved shapes;

the asymmetrical shape takes a first intermediate line passing through a center of the segment width;

at an outer peripheral tip end part where a contour curve of the outer peripheral surface in the segment longitudinal section is traced, among two positions on the contour curve corresponding to a position at a distance of 3 µm from the outer peripheral vertex toward the inner peripheral side in the segment radial direction, a position on the engine combustion chamber side is a position a1 and a position on the side distant from the engine combustion chamber is a position b1;

when a length of a line segment between the position a1 and the position b1 is L and an intermediate line of the line segment of the length L is a second intermediate line, the second intermediate line is located on the side more distant from the engine combustion chamber than the first intermediate line, and the outer periphery vertex of the segment is located on the second intermediate line or on the side more distant from the engine combustion chamber than the second intermediate line; and the pair of segments are installed in the oil ring groove so that the respective outer periphery vertexes are located on the side distant from the engine combustion chamber.

Further, in another aspect of the present invention, it is preferable in the above-described invention that: the contour curve of the outer peripheral surface in the segment longitudinal section is traced from the outer peripheral vertex of the segment to at least 0.025 mm toward the inner peripheral side in the segment radial direction so that a symmetrical shape taking both end sides in an axial direction as a pair exists on inner peripheral side positions in the segment radial direction;

when the contour curve of the asymmetrical shape at the segment outer peripheral tip end part is sectioned into a curved portion sandwiched between the outer peripheral vertex and a distance of 1.5 µm from the outer peripheral vertex toward the inner peripheral side in the segment radial direction and a contour portion sandwiched between the distance of 1.5 µm and a distance of 3.0 µm from the outer peripheral vertex toward the inner peripheral side in the segment radial direction, a first contour section, a second contour section, and a third contour section are set from the engine combustion chamber side of the cylinder;

the first contour section is provided at a part of a linear shape or a part of a quadratic curve shape starting from a first end portion on the engine combustion chamber side of the second contour section;

the second contour section has the outer peripheral vertex at a intermediate thereof and is provided in an arc shape;

the third contour section is provided to be a part of a quadratic curve shape starting from a second end portion on the side distant from the engine combustion chamber of the second contour section;

a surface roughness of the asymmetrical portion of the segment outer peripheral surface is 0.6 µmRp or less;

a length on the position a1 side and a length on the position b1 side of the line segment L divided by a line in the radial direction orthogonal to a line segment between the position a1 and the position b1 of the outer peripheral tip end part in the contour curve and passing through the outer peripheral vertex, are L1 and L2 respectively;

further, when at two positions on the contour curve at the distance of 1.5 µm toward the inner peripheral side in the segment radial direction, a position on the engine combustion chamber side is a position a2 and a position on the side distant from the engine combustion chamber is a position b2, and a length of a line segment between the position a2 and the position b2 is L3, conditions of 0.05 mm≤L≤0.15 mm, L1/L≥0.5, and L3/L≤0.74 are satisfied;

when an angle formed between a first straight line passing through the position a1 and through the position a2 and the axial direction of the cylinder is an angle θ1, a condition of 2 degrees ≤θ1≤7 degrees is satisfied; and when an angle formed between a second straight line passing through the position b1 and through the position b2 and the axial direction of the cylinder is an angle θ2, a condition of 9 degrees ≤θ2 is satisfied.

Further, in another aspect of the present invention, it is preferable in the above-described invention that regarding the angle θ1, a condition of 3 degrees ≤θ1≤6 degrees is satisfied.

Further, in another aspect of the present invention, it is preferable in the above-described invention that: the contour curve of the outer peripheral surface in the segment longitudinal section is traced from the outer peripheral vertex of the segment to at least 0.025 mm toward the inner peripheral side in the segment radial direction so that a symmetrical shape taking both end sides in an axial direction as a pair exists on inner peripheral side positions in the segment radial direction;

when the contour curve of the asymmetrical shape at the segment outer peripheral tip end part is sectioned into a curved portion sandwiched between the outer peripheral vertex and a distance of 1.5 µm from the outer peripheral vertex toward the inner peripheral side in the segment radial direction and a contour portion sandwiched between the distance of 1.5 µm and a distance of 3.0 µm from the outer peripheral vertex toward the inner peripheral side in the segment radial direction, a first contour section, a second contour section, and a third contour section are set from the engine combustion chamber side of the cylinder;

the first contour section is provided at a part of a linear shape or a part of a quadratic curve shape starting from a first end portion on the engine combustion chamber side of the second contour section;

the second contour section has a flat part at a intermediate thereof, and is provided in a shape composed of a part of a linear shape or a part of a quadratic curve shape from an end portion on the engine combustion chamber side in the axial direction of the flat part and continuous to the first contour section, and composed of a part of a quadratic curve shape from an end portion on the side distant from the engine combustion chamber in the axial direction of the flat part and continuous to the third contour section;

the third contour section is provided to be a part of a quadratic curve shape continuous to the second end portion;

a surface roughness of the asymmetrical portion of the segment outer peripheral surface is 0.6 µmRp or less;

a length on the position a1 side and a length on the position b1 side of the line segment L divided by a line in the radial direction orthogonal to a line segment between the position a1 and the position b1 of the outer peripheral tip end part in the contour curve of the segment outer peripheral surface and passing through the outer peripheral vertex, are L1 and L2 respectively;

further, when at two positions on the contour curve at the distance of 1.5 µm toward the inner peripheral side in the segment radial direction, a position on the engine combustion chamber side is a position a2 and a position on the side distant from the engine combustion chamber is a position b2, a length of a line segment between the position a2 and the position b2 is L3, and a length in the axial direction of the flat part in the second contour section is L4, conditions of 0.05 mm≤L≤0.15 mm, L1/L≥0.5, L3/L≤0.76, and 0<L4≤0.05 mm are satisfied;

when an angle formed between a first straight line passing through the position a1 and through the position a2 and the axial direction of the cylinder is an angle θ1, a condition of 3 degrees ≤θ1≤6 degrees is satisfied; and when an angle formed between a second straight line passing through the position b1 and through the position b2 and the axial direction of the cylinder is an angle θ2, a condition of 9 degrees ≤θ2 is satisfied.

Further, in another aspect of the present invention, it is preferable in the above-described invention that: the outer peripheral surface of the segment has one of coating films:

(1) a coating film by an ion plating method, composed of a nitride of one kind or two kinds selected from among chromium and titanium;

(2) a coating film by an ion plating method, composed of a nitride of one kind or two kinds selected from among chromium and titanium, and containing aluminum;

(3) the coating film by the ion plating method of (1) further solid-dissolving at least one element selected from among oxygen, carbon and boron;

(4) a coating film by an ion plating method in which metal chromium solid-dissolving nitrogen and $Cr_2N$ mixedly exist;

(5) a DLC (amorphous carbon) coating film by an ion plating method using only carbon;

(6) a DLC (amorphous carbon) coating film by an ion plating method containing one kind or two or more kinds of elements among silicon, oxygen, hydrogen, tungsten, and titanium in addition to carbon; and (7) a coating film constituted by covering any of the DLC coating film of the (5) and the DLC coating film of the (6) on any of the coating films of the (1), the (2), the (3), and the (4):

a surface hardness of each of the coating films from the coating film of the (1) to the (7) is HV 1000 or more: and a thickness of each of the coating films of the coating film of (1) to the (6) is 3 μm or more, and a thickness of a plurality of layers of the (7) is 3 μm or more.

Advantageous Effects of Invention

In a combination oil ring according to the present invention, it becomes possible to reduce the oil consumption in a high-speed region where the engine becomes high revolution even if the oil ring tension is low.

DESCRIPTION OF EMBODIMENTS

Hereinafter, a combination oil ring 10 according to one embodiment of the present invention will be described based on the drawings.

<1. Regarding the Configuration of the Combination Oil Ring 10>

Figure 1:
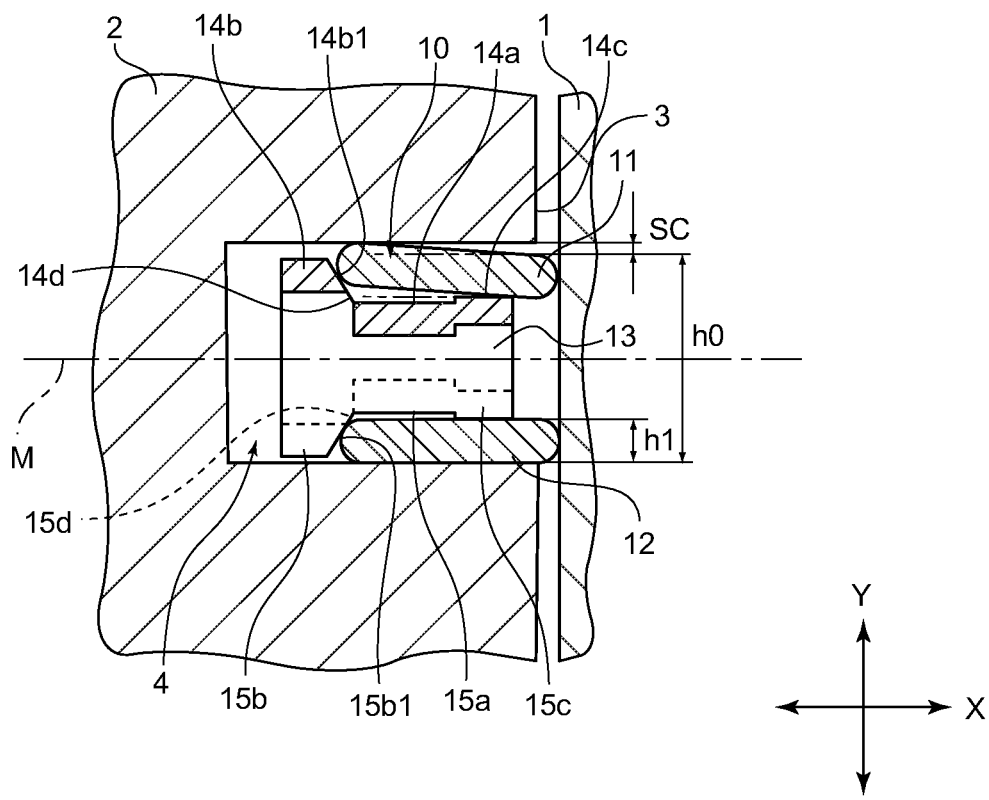
FIG. 1 is a longitudinal sectional view illustrating a configuration of a combination oil ring according to an embodiment of the present invention and illustrating a state that a piston in which the combination oil ring is installed is inserted into a cylinder.

FIG. 1 is a longitudinal sectional view illustrating a configuration of the combination oil ring 10 and illustrating a state that a piston 2 in which the combination oil ring 10 is installed is inserted into a cylinder 1.

In FIG. 1, inside the cylinder 1 of an engine of a motor vehicle or the like, the piston 2 is arranged which is capable of reciprocation. In an outer peripheral surface 3 of the piston 2, either two or three annular grooves are provided (illustration of one or two grooves on an engine combustion chamber side is omitted). On a crank shaft side (not illustrated) most distant among them from the engine combustion chamber, an oil ring groove 4 is provided. In the oil ring groove 4, the combination oil ring 10 is installed. This combination oil ring 10 has an oil control function and forms an oil film so that an engine oil existing on an inner wall of the cylinder 1 becomes an appropriate thickness.

As illustrated in FIG. 1, the combination oil ring 10 is a 3-piece combination oil ring, and formed of steel as a main component. The combination oil ring 10 has a pair of segments (side rails) 11, 12, and an expander spacer 13 arranged between them. The pair of segments 11, 12 each have a same predetermined segment width h1 as illustrated in FIG. 1. Here, the segment width h1 refers to the dimension of each of the segments 11, 12 in an axial direction (a Y-direction) of the cylinder 1. Further, the pair of segments 11, 12 are arranged to have a combination width h0. Here, the combination width h0 refers to an interval between an upper surface (a surface on the engine combustion chamber side) of the segment 11 and a lower surface (a surface on the side distant from the engine combustion chamber) of the segment 12. Further, the segment 11 is arranged while having a gap of a side clearance SC with respect to an upper wall on the engine combustion chamber side of the oil ring groove 4. Note that the side clearance SC refers to a dimensional difference between an oil ring groove width and the combination width h0.

Figure 2:
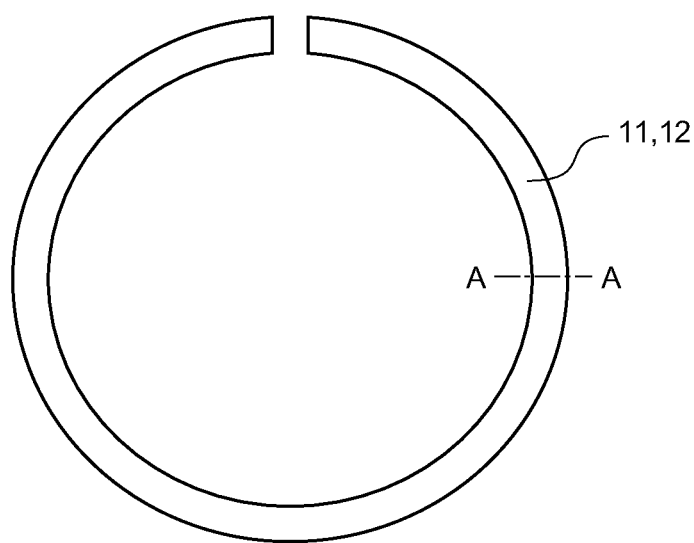
FIG. 2 is a plan view illustrating an external appearance of a segment.
Figure 3:
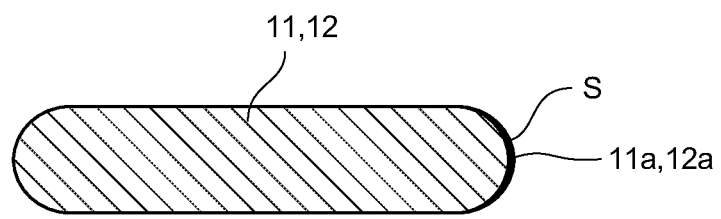
FIG. 3 is a longitudinal sectional view illustrating a state that the segment is cut along a line A-A in FIG. 2.

FIG. 2 is a plan view illustrating an external appearance of the segment 11, 12. FIG. 3 is a longitudinal sectional view illustrating a state that the segment 11, 12 is cut along a line A-A in FIG. 2. As illustrated in FIG. 2, the segment 11, 12 is provided such that its external appearance is annular. Further, end faces in its circumferential direction face each other with a narrow gap therebetween at an gap. Further, as illustrated in FIG. 3, the segment 11, 12 is provided with a hard coating film 11a, 12a for improving the abrasion resistance, on the side of its outer peripheral surface S. However, as the configuration without the hard coating film 11a, 12a, gas nitriding, salt-bath nitriding, or ion nitriding may be employed. Note that the shape of a tip end part SA of the outer peripheral surface S of the segment 11, 12 (the shape of the outer peripheral surface S in an arbitrary longitudinal section) will be described later. Further, concrete material and forming method of the hard coating film 11a, 12a will also be described later.

Figure 4:
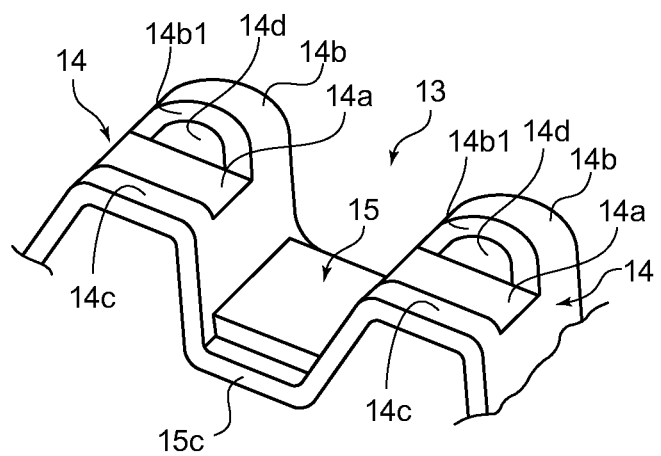
FIG. 4 is a perspective view illustrating a configuration of an expander spacer.

FIG. 4 is a perspective view illustrating the configuration of the expander spacer 13. As illustrated in FIG. 4, the expander spacer 13 is provided in a wave form alternately facing one of the segment 11 and the segment 12 when it proceeds along its circumferential direction. The expander spacer 13 is provided in such a wave form and thereby forms a gap between the segment 11 and the segment 12 and ensures a passageway of the engine oil. Note that the expander spacer 13 is provided such that its external appearance is annular, and is installed in the oil ring groove 4 with its end faces in the circumferential direction confronting each other.

Hereinafter, a portion of the expander spacer 13 located on the engine combustion chamber side than a center line M in the axial direction of the cylinder 1 is regarded as an upper projecting part 14, and a portion thereof located on the side more distant from the engine combustion chamber than the center line M is regarded as a lower projecting part 15. The upper projecting part 14 and the lower projecting part 15 are repeatedly and periodically consecutive in the circumferential direction of the expander spacer 13, whereby the expander spacer 13 is formed to have many wave-form portions.

The upper projecting part 14 and the lower projecting part 15 are formed into a wave form by performing plastic forming on the expander spacer 13. In addition, the upper projecting part 14 has an upper piece part 14a, an ear part 14b, and an outer peripheral support part 14c. The upper piece part 14a is a portion facing the segment 11 and substantially horizontally provided, but, not limited to this, may be provided with, for example, a recessed groove in a direction from a middle position in the circumferential direction of the outer peripheral support part 14c toward a middle position in the circumferential direction of the ear part 14b.

Further, the ear part 14b is located on the inner peripheral side than the upper piece part 14a, and additionally provided to project further to the engine combustion chamber side (in a direction distant from the center line M) than the upper piece part 14a. On the outer peripheral side of the ear part 14b, an inclined surface 14b1 inclined with respect to the axial direction of the cylinder 1 is provided, and the inclined surface 14b1 is inclined toward the outer peripheral side as it goes to the center line M. Against the inclined surface 14b1, a region on the inner peripheral side of the segment 11 comes into abutment. Besides, not limited to this, the inclined surface 14b1 does not have to be inclined toward the outer peripheral side as it goes to the center line M, also in which case the region on the inner peripheral side of the segment 11 comes into abutment against it. In a state that the piston 2 with the combination oil ring 10 installed therein is inserted into the cylinder 1, the segment 11 is pressed toward the inner wall side of the cylinder 1 (the outer peripheral side). Note that at a boundary portion between the ear part 14b and the upper piece part 14a, a communication hole 14d through which the engine oil can flow is provided, but a configuration without the communication hole 14d may be employed.

Further, the outer peripheral support part 14c is located on the outer peripheral side than the upper piece part 14a. The outer peripheral support part 14c is provided to project further to the engine combustion chamber side (in the direction distant from the center line M) than the upper piece part 14a. In addition, the outer peripheral support part 14c is a portion that supports, on its upper surface side, the segment 11. Therefore, the outer peripheral support part 14c projects less than the ear part 14b, and its upper surface is also substantially horizontally provided.

Further, the lower projecting part 15 is provided in a symmetrical shape across the center line M to the upper projecting part 14, and is provided adjacent to the upper projecting part 14. Therefore, the lower projecting part 15 also has a lower piece part 15a in a symmetrical shape to the upper piece part 14a, an ear part 15b in a symmetrical shape to the ear part 14b, and an outer peripheral support part 15c in a symmetrical shape to the outer peripheral support part 14c. Further, the ear part 15b is provided with an inclined surface 15b1 against which a region on the inner peripheral side of the segment 12 comes into abutment, and the inclined surface 15b1 is inclined toward the outer peripheral side as it goes to the center line M. Against the inclined surface 15b1, the region on the inner peripheral side of the segment 12 comes into abutment. Besides, not limited to this, the inclined surface 15b1 does not have to be inclined toward the outer peripheral side as it goes to the center line M, also in which case, in a state that the piston 2 with the combination oil ring 10 against which the region on the inner peripheral side of the segment 12 comes into abutment installed therein is inserted into the cylinder 1, the segment 12 is pressed toward the inner wall side of the cylinder 1 (the outer peripheral side). Further, at a boundary portion between the ear part 15b and the upper piece part 15a, a communication hole 15d through which the engine oil can flow is provided, but a configuration without the communication hole 15d may be employed.

Note that the outer peripheral support part 15c supports, on its lower surface side (a surface on a crankshaft side), the segment 12. Therefore, the segment 11 and the segment 12 are held in a state of being separated in the axial direction of the cylinder 1. Further, the segment 11 and the segment 12 are pressed by the inclined surfaces 14b1, 15b1 respectively, whereby the tip end parts SA on the outer peripheral surfaces S of the segments 11, 12 press the inner peripheral surface of the cylinder 1. This makes it possible to form an oil film so that the engine oil existing on the inner wall of the cylinder 1 becomes an appropriate thickness.

<2. Regarding the Shape of the Outer Peripheral Surface S of the Segment 11, 12>

Figure 5:
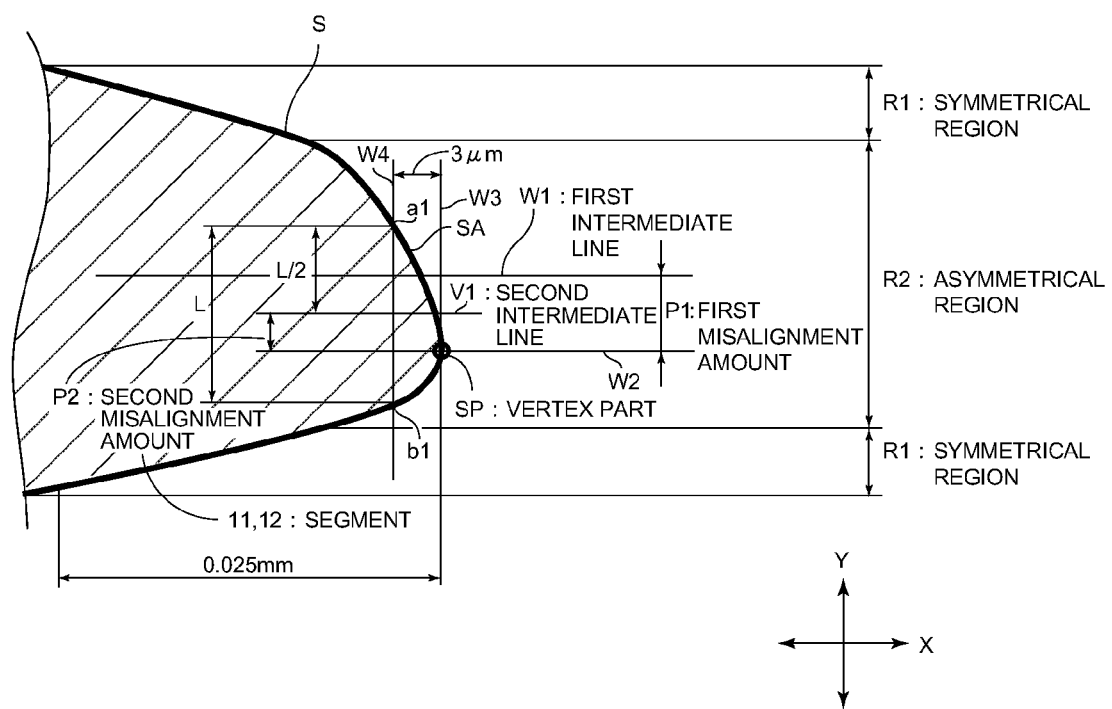
FIG. 5 is a partial contour curve illustrating the shape of an outer peripheral surface of the segment.

Subsequently, the shape of the outer peripheral surface S of the segment 11, 12 will be described. FIG. 5 is a partial contour curve illustrating the shape of the outer peripheral surface S of the segment 11, 12. Note that FIG. 5 is a model chart including the tip end part SA of the outer peripheral surface S, and this model chart corresponds to the contour curve when the magnification of a unit length in the axial direction (a Y-direction in FIG. 5) of the cylinder 1 and the magnification of a unit length in its radial direction (an X-direction in FIG. 5) are 200 times and 2000 times respectively.

As illustrated in FIG. 5, in a range in which the contour curve from an outer peripheral vertex of the segment 11, 12 to at least 0.025 mm toward the segment radial direction is traced in the contour curve when measuring the outer peripheral surface S of the segment 11, 12, the outer peripheral surface S of the segment 11, 12 in this embodiment has symmetrical regions R1 existing outside the tip end part SA in the axial direction of the cylinder 1 and an asymmetrical region R2 formed at the tip end part SA. Note that the contour curve refers to a profile curve in surface roughness measurement.

In this embodiment, the outer peripheral surface S of the segment 11, 12 has the symmetrical region R1 on the engine combustion chamber side, the asymmetrical region R2, and the symmetrical region R1 on the side distant from the engine combustion chamber.

Further, the asymmetrical region R2 is located between the two symmetrical regions R1. A contour curve of the asymmetrical region R2 is an asymmetrical shape with respect to a center axis of a line symmetry of the contour curve found from the two symmetrical regions R1. The center axis of this line symmetry is referred to as a first intermediate line W1.

Here, in the above-described FIG. 5, a misalignment amount can be found. More specifically, a straight line passing through a vertex part SP and along the radial direction (the X-direction in FIG. 5) is regarded as a line W2. Further, a line passing through the vertex part SP and orthogonal to the line W2 (namely, along the axial direction (the Y-direction in FIG. 5) of the cylinder 1) is regarded as a line W3. At this time, a misalignment amount P1 (a first misalignment amount) being a distance (a line segment length in the W3 direction) between the first intermediate line W1 and the line W2 is found. Note that the vertex part SP is a region on the outermost side in the above-described radial direction (the X-direction).

Further, in FIG. 5, in addition to the first intermediate line W1 and the line W2, a second intermediate line V1 is provided. The second intermediate line V1 is such as follows. Specifically, when among positions on the contour curve located in a region at a distance of 3 μm from the vertex part SP toward the inner peripheral side in the radial direction (the X-direction) and intersecting a line W4 orthogonal to the first intermediate line W1, a position on the engine combustion chamber side is a position a1 and a position on the side distant from the engine combustion chamber is a position b1, a length of a line segment between the position a1 and the position b1 is L, and an intermediate line of the line segment of the length L is referred to as V1. At this time, a misalignment amount P2 (a second misalignment amount) being a distance between the second intermediate line V1 and the line W2 is found.

Here, as illustrated in FIG. 5, the vertex part SP is located on the side more distant from the engine combustion chamber side by the second misalignment amount P2 than the second intermediate line V1, but the vertex part SP may be located on the second intermediate line V1. Further, the second intermediate line V1 is located on the side more distant from the engine combustion chamber than the first intermediate line W1.

Note that a display for identifying the direction on the engine combustion chamber side is applied on the segment 11, 12 having a predetermined asymmetrical shape. Further, each of the pair of segments 11, 12 is installed in the oil ring groove 4 such that its vertex part SP is located on the side distant from the engine combustion chamber.

<3. A First Shape of the Tip End Part SA of the Outer Peripheral Surface S of the Segment 11, 12>

Figure 6:
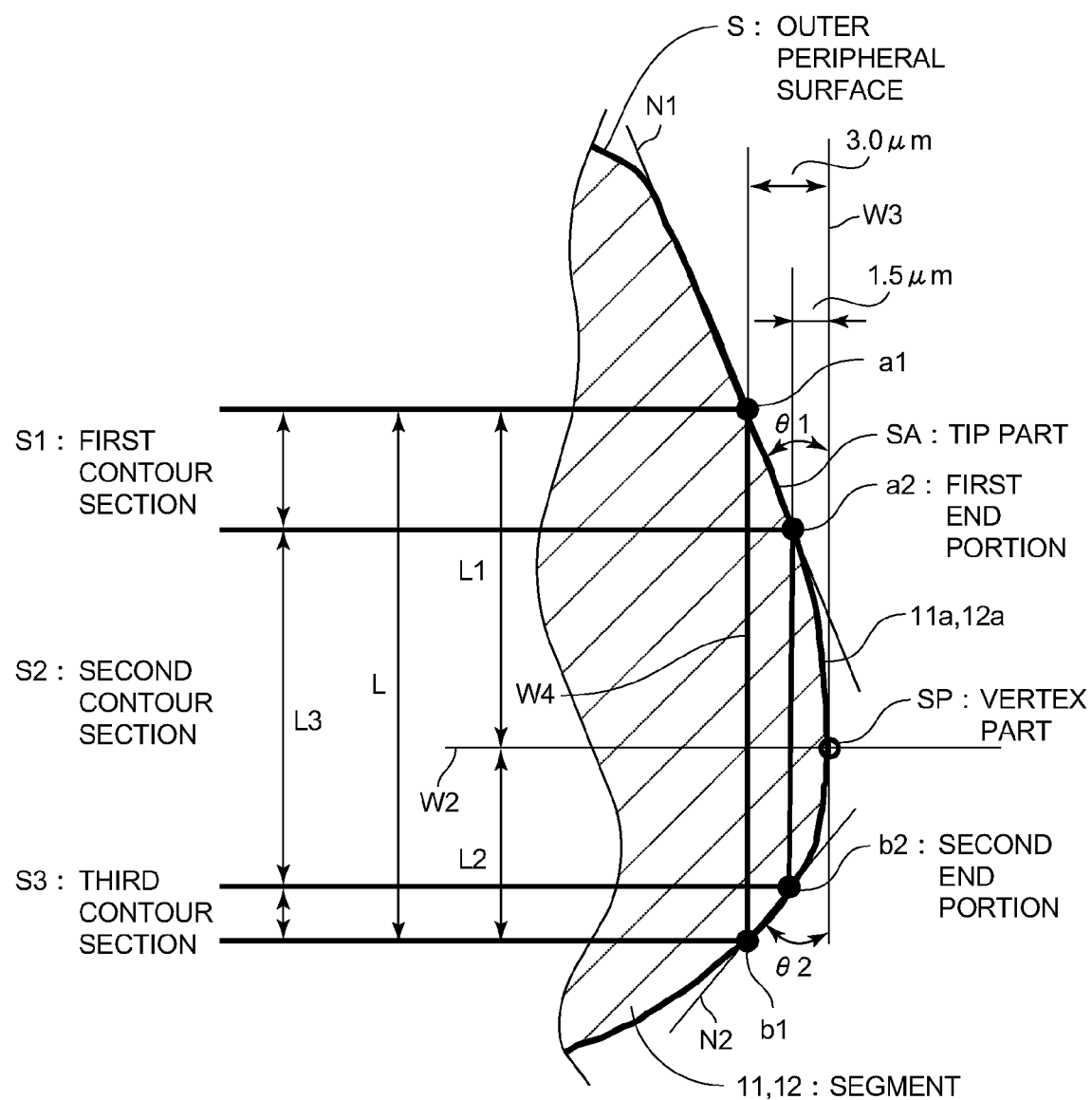
FIG. 6 is a partial contour curve illustrating an enlarged state of a tip end part of the outer peripheral surface of the segment in FIG. 5.

Subsequently, the first shape of the tip end part SA of the outer peripheral surface S of the segment 11, 12 will be described. FIG. 6 is a partial contour curve illustrating an enlarged state of the tip end part SA of the outer peripheral surface S of the segment 11, 12. Note that FIG. 6 is a model chart of the tip end part SA of the outer peripheral surface S, and this model chart corresponds to the contour curve when the magnification of a unit length in the axial direction (a Y-direction in FIG. 6) of the cylinder 1 and the magnification of a unit length in its radial direction (an X-direction in FIG. 6) are 1000 times and 2000 times respectively. In FIG. 6, the measurement magnification in the Y-direction of the shape of the outer peripheral surface S of the segment 11, 12 in FIG. 5 is made quintuple.

Further, in this Description, the tip end part SA of the outer peripheral surface S of the segment 11, 12 refers to the asymmetrical region R2 in the axial direction (the Y-direction) of the cylinder 1 in a range in which the contour curve from the outer peripheral vertex of the segment 11, 12 to at least 0.025 mm toward the radial direction (the X-direction) of the segment 11, 12 is traced in the contour curve when measuring the outer peripheral surface S of the segment 11, 12.

The segment 11, 12 in this embodiment is provided not in a symmetrical shape but in an asymmetrical shape, across the vertex part SP, in the axial direction (the Y-direction) of the cylinder 1 of the tip end part SA, at the tip end part SA of the outer peripheral surface S. Specifically, a continuous contour curve of the cross-section at the tip end part SA of the outer peripheral surface S existing in a region from the vertex part SP of the tip end part SA to a distance of 3 μm toward the inner peripheral side in the radial direction (the X-direction) is sectioned into three sections such as a first contour section S1, a second contour section S2, and a third contour section S3 from the engine combustion chamber side.

(1) First Aspect of the First Contour Section S1, the Second Contour Section S2, and the Third Contour Section S3

The first contour section S1 is provided, as illustrated in FIG. 6, starting from an end portion on the engine combustion chamber side of the second contour section S2 toward the engine combustion chamber side. This first contour section S1 is provided in a curved shape like a quadratic curve. However, it may be in a linear shape.

Further, at a intermediate portion in the second contour section S2, the vertex part SP exists. The end portion on the engine combustion chamber side of the second contour section S2 continues to the above-described first contour section S1. Further, an end portion on the side distant from the engine combustion chamber of the second contour section S2 continues to the third contour section S3. The second contour section S2 is provided in an arc shape. As the arc shape, for example, a curved shape approximating the quadratic curve can be exemplified. Further, the third contour section S3 exists on the side more distant from the engine combustion chamber than the vertex part SP. The third contour section S3 is provided to become a part of the quadratic curve starting from the end portion on the side distant from the engine combustion chamber of the contour section S2.

The surface roughness of the first contour section S1, the second contour section S2, and the third contour section S3 is 0.6 µmRp or less. Note that Rp is a kind of the parameter of roughness, and is the maximum peak height in ISO4287 (JIS B0601: '01).

Further, in the contour curve formed of the first contour section S1, the second contour section S2, and the third contour section S3 of the outer peripheral tip end part of the segment longitudinal section, two positions on the contour curve corresponding to a position at a distance of 3 µm from the outer peripheral vertex toward the inner peripheral side in the segment radial direction are a1, b1, and two positions on the contour curve corresponding to a position at a distance of 1.5 µm from the outer peripheral vertex toward the inner peripheral side in the segment radial direction are a2, b2.

Further, the distance between the position a1 and the position b1 (the length of the line segment W4) is L. Note that the line W2 passing through the vertex part SP is orthogonal to the line segment W4. Further, in the length L, a length on the position a1 side from the line W2 is L1, and a length on the position b1 side from the line W2 is L2. Furthermore, the distance in the axial direction (the Y-direction) of the cylinder 1 between the position a2 and the position b2 is L3. Then, the relationship of the following expression is satisfied.

$$0.05 \text{ mm} \leq L \leq 0.15 \text{ mm} \quad \text{[Expression 1]}$$

$$L1/L \geq 0.5 \quad \text{[Expression 2]}$$

$$L3/L \leq 0.74 \quad \text{[Expression 3]}$$

Further, the straight line passing through the position a1 and the position a2 is a straight line N1. An angle formed between the straight line N1 and the line W3 passing through the vertex part SP and along the axial direction (the Y-direction) of the cylinder 1 (namely, orthogonal to the radial direction (the X-direction)) is an angle θ1 (an upper angle θ1). Further, a straight line passing through the position b1 and the position b2 is a straight line $N_2$. An angle formed between the straight line $N_2$ and the line W3 is an angle θ2 (a lower angle θ2). Then, the angle θ1 and the angle θ2 satisfy the relationship of the following expression.

$$2 \text{ degrees} \leq \theta 1 \leq 7 \text{ degrees} \quad \text{[Expression 4]}$$

$$9 \text{ degrees} \leq \theta 2 \quad \text{[Expression 5]}$$

Note that the predetermined shapes of the first contour section S1 and the second contour section S2 of the outer peripheral surface S may be formed by machining or formed in shapes similar to a segment wire rod being the base material of the segment 11, 12. On the other hand, the third contour section S3 is formed in a shape similar to the base material of the segment 11, 12.

(2) Second Aspect of the First Contour Section S1, the Second Contour Section S2, and the Third Contour Section S3

Next, the second aspect of the first contour section S1, the second contour section S2, and the third contour section S3 will be described. In this second aspect, the above-describe angle θ1 satisfies the relationship of the following expression.

$$3 \text{ degrees} \leq \theta 1 \leq 6 \text{ degrees} \quad \text{[Expression 6]}$$

Figure 7:
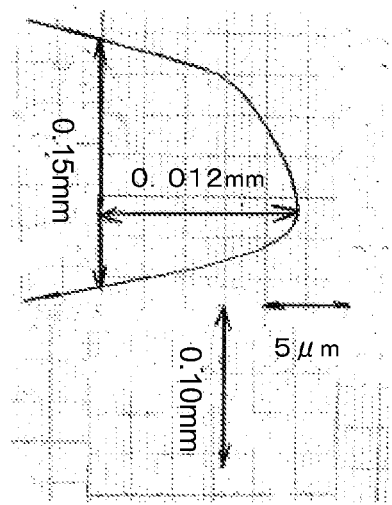
FIG. 7 is a contour curve when the outer peripheral surface of the segment in FIG. 5 is measured.
Figure 8:
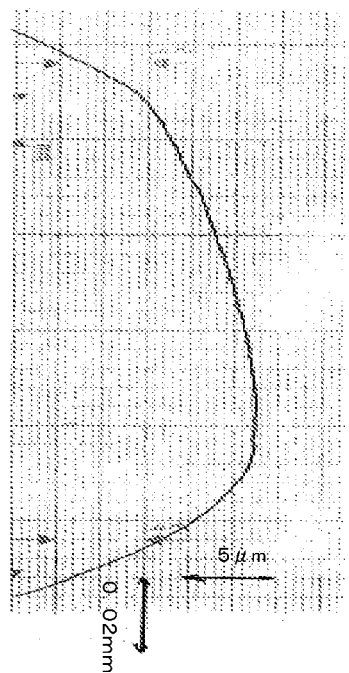
FIG. 8 is an enlarged contour curve when the tip end part of the outer peripheral surface of the segment in FIG. 7 is measured.

Note that the contour curve of the outer peripheral surface S when the segment 11 as illustrated in FIG. 6 is actually measured (embodiment) is illustrated in FIG. 7 and FIG. 8. FIG. 7 is a contour curve when the outer peripheral surface S is measured, and FIG. 8 is an enlarged contour curve illustrating the tip end part SA of the outer peripheral surface S measured in FIG. 7. The magnification in measurement in FIG. 7 is 2000 times in the radial direction (the X-direction) and 200 times in the axial direction (the Y-direction) of the cylinder 1. Further, the magnification in measurement in FIG. 8 is 2000 times in the radial direction (the X-direction) and 1000 times in the axial direction (the Y-direction) of the cylinder 1. Note that in the measurement of the contour curve, the measurement was performed in conformity to ISO 4287: '97 (JIS B0601: '01) (this also applies to the measurement of the other contour curve).

<4. Regarding a Second Shape of the Tip End Part SA of the Outer Peripheral Surface S of the Segment 11, 12>

Figure 9:
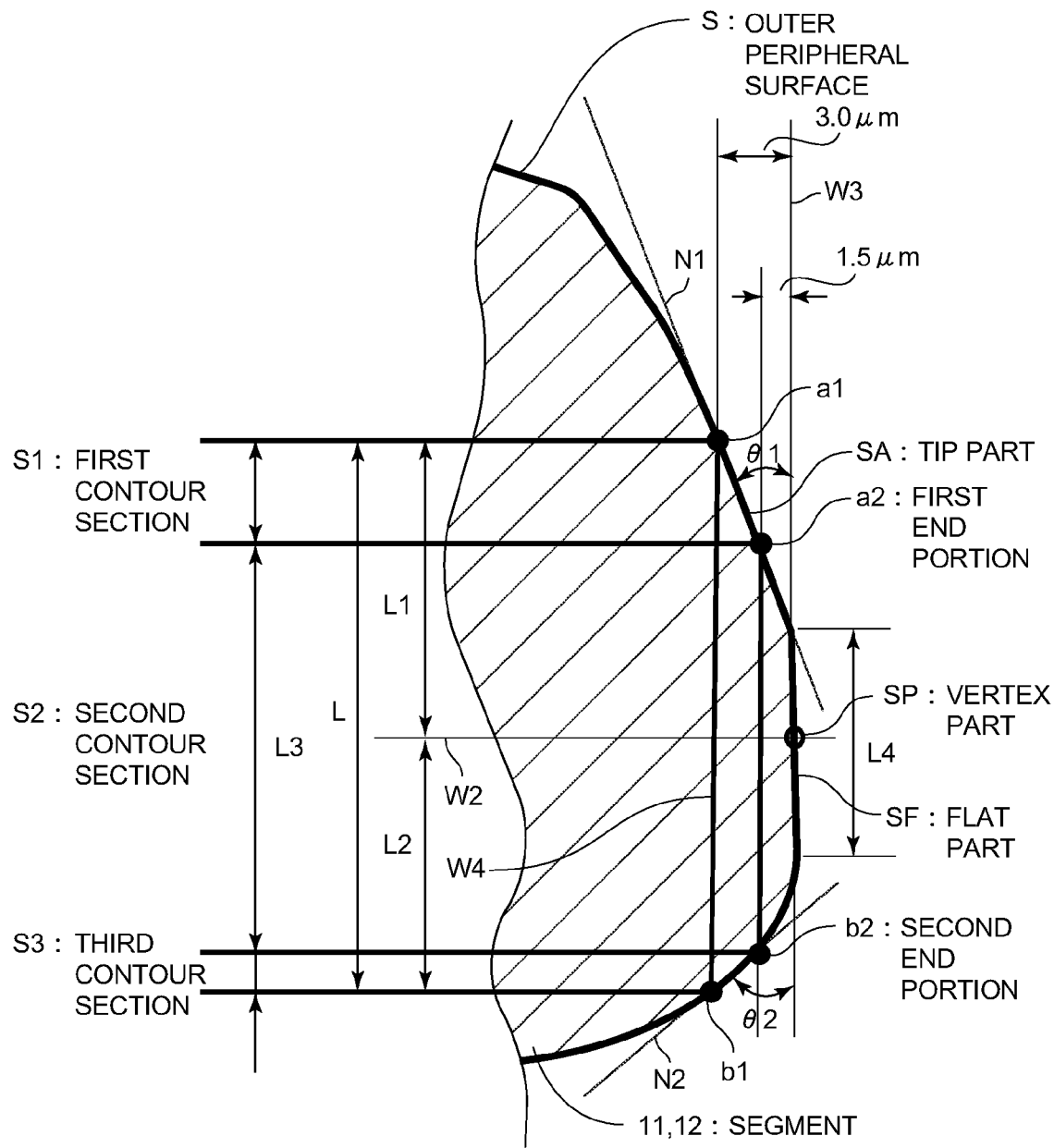
FIG. 9 is a partial contour curve illustrating an enlarged state of the tip end part of the outer peripheral surface of the segment in a shape different from that in FIG. 6.

Next, the second shape of tip end part SA of the outer peripheral surface S of the segment 11, 12 different from that in FIG. 6 will be described. FIG. 9 is a partial contour curve illustrating an enlarged state of the tip end part SA of the outer peripheral surface S of the segment 11, 12 in the second shape different from the first shape in FIG. 6. Note that FIG. 9 is a model chart of the tip end part SA of the outer peripheral surface S as with FIG. 6, and this model chart corresponds to the contour curve when the magnification of a unit length in the axial direction (a Y-direction in FIG. 9) of the cylinder 1 and the magnification of a unit length in its radial direction (an X-direction in FIG. 9) are 1000 times and 2000 times respectively. In the second shape, the first contour section S1, the second contour section S2, and the third contour section S3 in the first shape are as follows. The first contour section S1 is provided, as illustrated in FIG. 9, starting from an end portion on the engine combustion chamber side of a flat part of the second contour section S2 toward the engine combustion chamber side. The first contour section S1 is provided in a curved shape like a quadratic curve. However, it may be in a linear shape. The second contour section S2 is provided such that the flat part exists on the engine combustion chamber side and an end portion on the side distant from the engine combustion chamber of the flat part becomes a part of the quadratic curve continuing to the third contour section S3. The third contour section S3 exists on the side more distant from the engine combustion chamber than the flat part of the second contour section S2. The third contour section S3 is provided to be a part of the quadratic curve starting from an end portion on the side distant from the engine combustion chamber of the second contour section S2.

At the tip end part SA of the outer peripheral surface S of the segment 11, 12 illustrated in FIG. 9, a flat part SF is provided. Therefore, the line W2 orthogonal to the line segment W4 passes through the middle in the axial direction (the Y-direction) of the flat part SF in FIG. 9. Note that the outer peripheral surface S as illustrated in FIG. 9 also satisfies the relationships of the above-described [Expression 1], [Expression 2], [Expression 5] to [Expression 6]. However, the outer peripheral surface S as illustrated in FIG. 9 satisfies the relationship of [Expression 7] in place of [Expression 3].

$$L3/L \leq 0.76 \quad \text{[Expression 7]}$$

Further, in the outer peripheral surface S illustrated in FIG. 7, assuming that the distance between both end portions of the flat part SF is L4, the length L4 satisfies the relationship of the following [Expression 8].

$$0 < L4 \leq 0.05 \text{ mm} \qquad \text{[Expression 8]}$$

Note that also in the outer peripheral surface S as illustrated in FIG. 9, the contour of the cross-section of the flat part SF is in a linear shape or a curved shape, and the curved shape mentioned here forms a part of the quadratic curve, and a curvature radius at the outer peripheral vertex is preferably 0.209083 mm or more.

Figure 10:
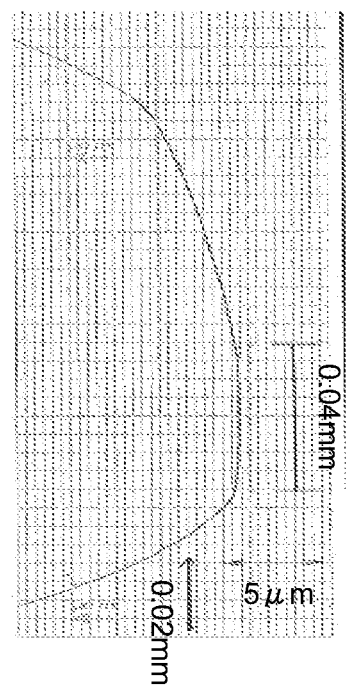
FIG. 10 is an enlarged contour curve when the tip end part of the outer peripheral surface of the segment in FIG. 9 is measured.

Here, FIG. 10 is an enlarged contour curve illustrating the tip end part SA of the outer peripheral surface S of the segment 11, 12 in FIG. 9, and is an enlarged contour curve of the tip end part SA of the outer peripheral surface S measured similarly to FIG. 8. The magnification in measurement in FIG. 10 is also 2000 times in the radial direction (an X-direction) and 1000 times in the axial direction (a Y-direction) of the cylinder 1 as in FIG. 8.

<5. Regarding a Forming Method of the Outer Peripheral Surface S of the Segment 11, 12>

Subsequently, the forming method of the outer peripheral surface S of the segment 11, 12 will be described. The outer peripheral surface S is formed into a predetermined shape by using, for example, a belt grinding apparatus and elastically pressing a rotating belt with abrasive particles of the belt grinding apparatus against the outer peripheral surface of one horizontally fixed segment using an elastic body. This shape may be formed in a state of the segment wire rod being the base material of the segment 11, 12. Further, the shape may be formed after molding into an annular shape, and may be formed by any of the methods.

<6. Regarding a Film-Forming Method of the Hard Coating Film 11a, 12a on the Outer Peripheral Surface S of the Segment 11, 12>

Next, the method of forming the hard coating film 11a, 12a on the outer peripheral surface S of the segment 11, 12 will be described. Note that as the hard coating film 11a, 12a, the one formed by any one of the following methods is selected.

(6-1) A Film-Forming Method of a Nitride Coating Film (PVD Coating Film)

First, the method of forming the nitride coating film being the hard coating film 11a, 12a on the outer peripheral surface S of the segment 11, 12 will be described. Examples of the film-forming method include a method of forming a film using an arc ion plating apparatus for performing an arc ion plating method being one kind of a physical vapor deposition (PVD) method. When forming the nitride coating film by the arc ion plating method, a metal target of Cr according to the composition of the hard coating film to be formed is used and the base material for the segment 11, 12 is set in the arc ion plating apparatus. Thereafter, the inside of the arc ion plating apparatus is reduced in pressure by evacuation and the base material is heated.

Thereafter, a bias voltage is applied to the base material to perform ion bombardment using the metal target. The bias voltage to be applied can be, for example, −500 to −1000 V. Next, another bias voltage is applied, and a process gas is introduced into the arc ion plating apparatus to form the hard coating film 11a, 12a with a predetermined thickness on an outer peripheral slide surface of the segment 11, 12. The another bias voltage can be, for example, 0 to −200 V. As the process gas, only a $N_2$ gas was used. Besides, as the process gas, an $O_2$ gas, a $CH_4$ gas or the like may be used. As the metal target, other than the above Cr, Ti may be used or Ti and Al may be used in combination.

(6-2) A Film-Forming Method of a Nitride Coating Film (PVD Coating Film) (a Partially Different Film-Forming Method)

In the film-formation of the nitride coating film (PVD coating film) in the above-described (6-1), a coating film using a nitride of one kind or two kinds selected from among Cr, Ti and containing Al as the metal target may be formed. In this case, the film-formation can be performed using a material made by mixing Cr and Al as the metal target, and using a mixed gas made by mixing a $N_2$ gas and a $CH_4$ gas, a $N_2$ gas and an $O_2$ gas, a $N_2$ gas and an Ar gas or the like as the process gas.

(6-3) A Film-Forming Method of a Nitride Coating Film (PVD Coating Film) (a Partially Different Film-Forming Method)

Further, a coating film composed of a nitride of one kind or two kinds selected from among Cr, Ti solid-dissolving at least one element selected from among O, C may be formed. In this case, a material made by mixing a $N_2$ gas and an $O_2$ gas or a $N_2$ gas and a $CH_4$ gas may be used as the process gas. Further, a coating film composed of a nitride of one kind or two kinds selected from among Cr, Ti solid-dissolving a B element may be formed. In this case, a material made by mixing Cr and B may be used as the metal target.

(6-4) A Film-Forming Method of a Nitride Coating Film (PVD Coating Film) (a Partially Different Film-Forming Method)

Further, a coating film in which metal chromium solid-dissolving nitrogen and $Cr_2N$ mixedly exist may be formed. In this case, a mixed gas made by mixing a $N_2$ gas and an Ar gas may be used as the process gas.

(6-5) A Film-Forming Method of an Amorphous Carbon Coating Film (DLC Coating Film)

Next, a method of film-forming an amorphous carbon coating film (DLC (diamond like carbon) coating film) as the hard coating film 11a, 12a on the outer peripheral surface S of the segment 11, 12 will be described. The method of forming the DLC coating film can use the arc ion plating apparatus for performing the arc ion plating method. In the arc ion plating apparatus, the base material of the segment 11, 12 is set. Thereafter, the inside of the arc ion plating apparatus is reduced in pressure by evacuation and the base material is heated. Thereafter, a bias voltage is applied to the segment base material to perform ion bombardment using argon ions. The bias voltage to be applied can be, for example, −50 to −300 V.

Then, after a predetermined bias voltage is applied, a Ti coating film is formed as an adhesive layer. The predetermined bias voltage can be, for example, −50 to −300 V. Then, a DLC coating film (an a-C layer) composed of an amorphous carbon structure is formed on the Ti coating film by sputtering using argon ions. In this event, the bias voltage is set to, for example, −50 to −300 V. Furthermore, a DLC coating film (a ta-C layer) composed of a tetrahedral carbon structure is formed on the a-C layer by filtered arc ion plating. In this event, the bias voltage is set to, for example, −100 to −300 V. These two layers are alternately and repeatedly stacked to form the hard coating film 11a, 12a with a predetermined thickness on an outer peripheral slide surface of the segment base material.

(6-6) A Film-Forming Method of an Amorphous Carbon Coating Film (DLC Coating Film) (a Partially Different Film-Forming Method)

In the film-formation of the DLC coating film in the above-described (6-5), a DLC coating film containing one kind or two or more kinds of elements such as Si, O, H, W, Ti in addition to carbon may be formed. Further, as the film-forming method of the DLC coating film, a chemical vapor deposition (CVD) method may be used.

(6-7) Regarding a Composite Coating Film

Further, on the outer periphery of one of the nitride coating films of the above-described (6-1) to (6-4), the DLC coating film of one of the DLC coating film of (6-5) and the coating film of (6-6) may be formed to form the hard coating film 11a, 12a.

<7. Regarding a Method of an Oil Consumption Measurement Test>

Subsequently, the oil consumption measurement test performed using the combination oil ring 10 in this embodiment will be described. In the oil consumption measurement test, an engine having a 2 L class displacement and a 80 mm class bore diameter was used. After break-in of the engine, an engine oil of 5W-20 (viscosity classification SAE J300) was used with a cooling water temperature set to 100° C. and an engine oil temperature set to 125° C., under a load condition WOT (wide open throttle; full load).

Then, the oil consumption was evaluated under the condition that a mean piston speed of the engine was in a high-speed region at two levels of 20.2 m/s and 18.9 m/s. The mean piston speed is a mean speed of the piston 2 found from the engine revolution speed and the stroke of the engine. As the oil consumption measurement, the oil consumption per hour was measured by a continuous gravimetric method. Note that the operating time after the break-in until the end of the oil consumption measurement test was about 70 hours.

As a top ring of piston rings used in the test, the one having a width (the dimension in the axial direction of the cylinder 1) of 1.2 mm and having a hard coating film by the PVD method applied on its outer peripheral surface was used. Further, as a second ring, the one having a width (the dimension in the axial direction of the cylinder 1) of 1.2 mm and having a hard Cr plating applied on its outer peripheral surface was used. As the combination oil ring 10, the one having a combination width h0 of 2.0 mm and a segment width h1 of the segment 11, 12 of 0.4 mm was used. Further, the oil ling tension was set to 0.24 (N/mm) in bore diameter ratio, which is equal to or less than 0.3 (N/mm) that is called a low tension.

As the base material of the segment 11, 12, the one using a material corresponding to JIS SUS440B and having a CrN coating film (a film thickness of 20 μm, a Vickers hardness HV of 1100) being a hard coating film by the arc ion plating method applied on the outer peripheral surface of the segment 11, 12 was used. Regarding the shape of the outer peripheral surface S of the segment 11, 12, the outer peripheral surface S was variously formed into asymmetrical convex shapes based on the shape having a measured width of 0.15 mm and having a drop (a distance in the radial direction) from the vertex part SP of the outer peripheral surface S of 0.008 to 0.015 mm that is a conventionally employed symmetrical convex shape, and supplied for the test.

The side clearance SC between the combination oil ring 10 and the oil ring groove 4 of the piston 2 is generally in a range of 0.07 mm to 0.15 mm, but the side clearance SC was set to 0.11 mm in this test.

Note that regarding measurement of the above Vickers hardness, after a measurement sample was polished into a mirror surface, and then the Vickers hardness was measured by a micro Vickers hardness tester under conditions of a test force of 0.9807 N and a test force retention time of 15 s in conformity to "Vickers hardness test-test method" of JIS Z 2244 (this also applies to the other Vickers hardness).

Further, regarding the measurement of the above second misalignment amount P2, when the contour curve from the vertex part SP of the outer peripheral surface S of the segment 11, 12 to at least a distance of 0.025 mm toward the inner peripheral side in the radial direction (the X-direction) is measured, the magnification in the radial direction (the X-direction) of the segment 11, 12 is 2000 times, and the magnification in the axial direction (the Y-direction) of the cylinder 1 is 200 times. Further, the measurement position is set at three positions of 90 degrees, 180 degrees, and 270 degrees in the circumferential direction from the gap of the segment 11, 12, and as the measured value in Table 1, the average value at the three positions is used.

Further, for the measurement of the outer peripheral shape (contour curve) of the outer peripheral surface S of the segment 11, 12, a stylus-type surface roughness measuring instrument (Surf Coder SE-30C) manufactured by Kosaka Laboratory Ltd. was used, and as a detector, PU-DJ2S (a radius of a tip spherical surface of 2 μm, a tapered angle of a cone of 60 degrees) was used. Further, the feeding speed of the lateral magnification was 0.1 mm/s when the magnification in the axial direction (the Y-direction) of the cylinder 1 was 200 times, and the feeding speed of the lateral magnification was 0.05 mm/s when the magnification in the axial direction (the Y-direction) of the cylinder 1 was 1000 times, but the speed may be lower than them.

The result when the oil consumption measurement was performed under such conditions was listed in Table 1. In Table 1, the length L of the line segment W4 between the position a1 and the position b1 (L=L1+L2), L1/L relating to [Expression 2], L3/L relating to [Expression 3], the length L4 of the flat part SF, and the second misalignment amount P2 are also listed in addition to the type of the shape of the outer peripheral surface S (outer peripheral shape), the upper angle θ1, and the lower angle θ2.

TABLE 1

| | OUTER PERIPHERAL SHAPE | UPPER ANGLE θ1 (°) | LOWER ANGLE θ2 (°) | L = L1 + L2 | L1/L | L3/L | FLAT PART LENGTH L4 | SECOND MIS-ALIGNMENT AMOUNT | OIL CONSUMPTION RATIO V = 20.2 m/s | V = 18.9 m/s | (REFERENCE) V = 14.3 m/s |
|---|---|---|---|---|---|---|---|---|---|---|---|
| EXAMPLE 1 | FIRST SHAPE | 2.0 | 16.7 | 0.072 | 0.833 | 0.500 | — | 0.038 | 78 | 56 | 13 |
| EXAMPLE 2 | FIRST SHAPE | 2.0 | 9.0 | 0.150 | 0.815 | 0.740 | — | 0.020 | 80 | 60 | 12 |
| EXAMPLE 3 | FIRST SHAPE | 2.7 | 12.5 | 0.120 | 0.760 | 0.733 | — | 0.023 | 73 | 55 | 14 |
| EXAMPLE 4 | FIRST SHAPE | 4.3 | 13.0 | 0.097 | 0.705 | 0.701 | — | 0.038 | 67 | 50 | 10 |
| EXAMPLE 5 | FIRST SHAPE | 6.0 | 16.0 | 0.070 | 0.660 | 0.714 | — | 0.030 | 73 | 52 | 14 |
| EXAMPLE 6 | FIRST SHAPE | 6.5 | 18.5 | 0.058 | 0.640 | 0.707 | — | 0.033 | 70 | 55 | 12 |
| EXAMPLE 7 | FIRST SHAPE | 7.0 | 19..0 | 0.050 | 0.560 | 0.680 | — | 0.045 | 75 | 58 | 14 |
| EXAMPLE 8 | SECOND SHAPE | 3.0 | 16.7 | 0.131 | 0.603 | 0.748 | 0.050 | 0.023 | 75 | 57 | 12 |

TABLE 1-continued

| | OUTER PERIPHERAL SHAPE | UPPER ANGLE θ1 (°) | LOWER ANGLE θ2 (°) | L = L1 + L2 | L1/L | L3/L | FLAT PART LENGTH L4 | SECOND MIS-ALIGNMENT AMOUNT | OIL CONSUMPTION RATIO V = 20.2 m/s | V = 18.9 m/s | (REFERENCE) V = 14.3 m/s |
|---|---|---|---|---|---|---|---|---|---|---|---|
| EXAMPLE 9 | SECOND SHAPE | 4.1 | 15.2 | 0.097 | 0.680 | 0.732 | 0.039 | 0.028 | 72 | 55 | 10 |
| EXAMPLE 10 | SECOND SHAPE | 6.0 | 16.7 | 0.082 | 0.610 | 0.760 | 0.046 | 0.018 | 77 | 55 | 12 |
| COMPARATIVE EXAMPLE 1 | CONVENTIONAL SHAPE | 7.5 | 7.5 | 0.088 | 0.500 | 0.727 | — | 0.000 | 100 | 66 | 12 |
| COMPARATIVE EXAMPLE 2 | FIRST SHAPE | 1.7 | 8.5 | 0.152 | 0.550 | 0.836 | — | 0.015 | 95 | 66 | 14 |

Figure 11:
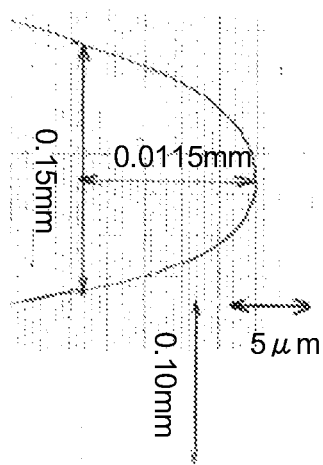
FIG. 11 is a contour curve when the outer peripheral surface of a segment in Comparative Example 1 was measured similarly to FIG. 7.
Figure 12:
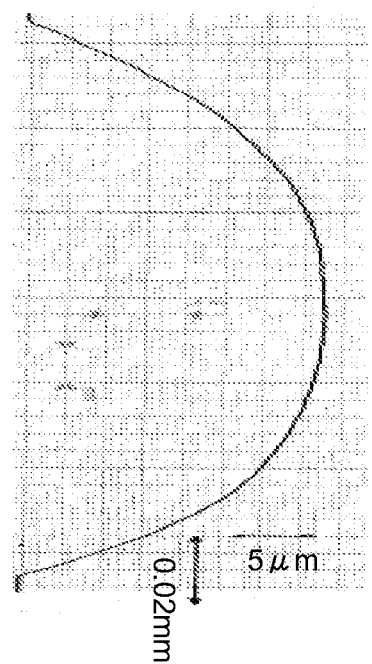
FIG. 12 is an enlarged contour curve when a tip end part of the outer peripheral surface of the segment in FIG. 11 is measured.

Note that in Table 1, Examples 1 to 7 indicate the case of using the segments 11, 12 of the outer peripheral surfaces S in the first shape as illustrated in FIG. 6, and Examples 8 to 10 indicate the case of using the segments 11, 12 of the outer peripheral surfaces S in the second shape as illustrated in FIG. 9. Further, Comparative Example 1 indicates the case of using the segments in conventional shape in a symmetrical shape in which the angle θ1 being the upper angle is 7.5 degrees and the angle θ2 being the lower angle is 7.5 degrees. Note that the contour curve of the outer peripheral surface S when the segment 11 relating to Comparative Example 1 was actually measured is illustrated in FIG. 11 and FIG. 12. FIG. 11 is a contour curve when the outer peripheral surface S of Comparative Example 1 was measured, and FIG. 12 is an enlarged contour curve illustrating the tip end part SA of the outer peripheral surface S measured in FIG. 11. The magnification in measurement in FIG. 11 is 2000 times in the radial direction (the X-direction) and 200 times in the axial direction (the Y-direction) of the cylinder 1 as in FIG. 7. Further, the magnification in measurement in FIG. 12 is 2000 times in the radial direction (the X-direction) and 1000 times in the axial direction (the Y-direction) of the cylinder 1 as in FIG. 8.

Further, regarding Comparative Example 2, the angle θ1 being the upper angle does not satisfy [Expression 4], the angle θ2 being the lower angle does not satisfy [Expression 5], the length L of the line segment W4 does not satisfy [Expression 1], and the L3/L being the ratio of the length L3 between the position a1 and the position b1 with respect to the length L does not satisfy [Expression 3].

Note that regarding the oil consumption ratio in Table 1, the oil consumption in the case of using the segments in the conventional shape in a symmetrical shape in which the angle θ1 being the upper angle is 7.5 degrees and the angle θ2 being the lower angle is 7.5 degrees as indicated in Comparative Example 1 (conventional shape) and the mean piston speed when using the segment of 20.2 m/s, is regarded as 100, other oil consumptions are indicated in ratio.

<8. Review of the Result of the Shape of the Outer Peripheral Surface S and the Oil Consumption Measurement Test>

Among the above, the angle θ1 in the case of 2 degrees or more and 7 degrees or less as expressed in [Expression 4], is considered to be an angle at which the engine oil forming the oil film on the inner wall surface is easy to flow in from the engine combustion chamber side of the outer peripheral surface S of the segment 11, 12 in an oil ring rising process, and to be able to suppress the action of the segment 11, 12 scraping up the engine oil on the inner wall surface of the cylinder 1. Therefore, there appears an effect in reduction of the oil consumption in a high-speed region that is said that the oil film becomes thicker. Here, the engine oil scraping action by the segment 11, 12 is said to promote disappearance of the engine oil by its combustion during engine combustion and the discharge of the engine oil in an engine exhaust process, whereby the oil consumption increases.

In contrast, when the angle θ1 being the upper angle of the segment 11, 12 becomes less than 2 degrees, the engine oil forming the oil film on the inner wall surface of the cylinder 1 becomes difficult to flow in from the engine combustion chamber side of the outer peripheral surface S of the segment 11, 12 when the combination oil ring 10 rises up. For this reason, the engine oil is considered to stay in the gap formed between the inner wall surface of the cylinder 1 and the outer peripheral surface S of the segment 11, 12 on the engine combustion chamber side and the engine oil is conveyed to the raised end of the of the segment 11, 12, so that the reduction of the oil consumption cannot be expected.

On the other hand, when the angle θ1 being the upper angle of the segment 11, 12 is more than 7 degrees, the action of the segment 11, 12 of scraping up the engine oil on the inner wall surface of the cylinder 1 increases to increase the oil consumption.

Further, setting the angle θ2 being the lower angle of the segment 11, 12 to 9 degrees or more as expressed in [Expression 5] is preferable in forming the outer peripheral shape of the segment 11, 12 forming the angle θ1 being the upper angle to 2 degrees or more and 7 degrees or less as expressed in [Expression 4] into an asymmetrical shape.

Here, the angle θ2 being the lower angle of the segment 11, 12 in the case of less than 9 degrees, corresponds to the lower angle θ2 when the contour curve of the conventional segment is symmetric as in Comparative Example 1 in the above Table 1. As in found from Table 1, the lower angle θ2 in the case of less than 9 degrees is not preferable because the reduction of the oil consumption in a high-speed region of the engine cannot be expected.

Further, the surface roughness in the asymmetrical region R2 in the axial direction (the Y-direction) of the cylinder 1 in the case of 0.6 μmRp or less on the outer peripheral surface S of the segment 11, 12, is preferable in reducing the friction between the outer peripheral surface S of the segment 11, 12 and the inner wall surface of the cylinder 1. However, the surface roughness in the asymmetrical portion in the case of more than 0.6 μmRp, is not preferable because it becomes more likely to induce generation of scuff in the inner wall surface of the cylinder 1 and abrasion of the cylinder 1.

Further, as in the result of Table 1, when the angle θ1 satisfies the above-described [Expression 6], the oil consumption ratio is further reduced, resulting in a preferable state.

Figure 13:
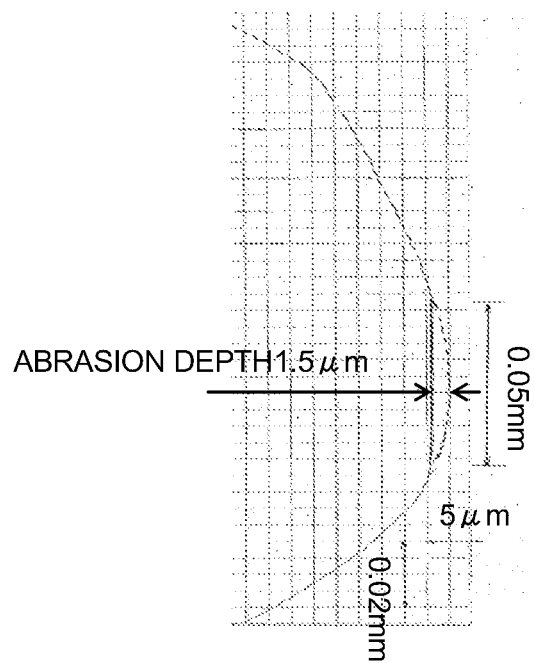
FIG. 13 is an enlarged contour curve when a tip end part of the outer peripheral surface of the segment in FIG. 6 is measured after an oil consumption measurement test for about 70 hours was finished, and explains an abrasion depth at a tip end part of the outer peripheral surface of the segment.

FIG. 13 is a chart indicating an abrasion amount after an oil consumption measurement test for about 70 hours is finished at the tip end part SA of the outer peripheral surface S as indicated in FIG. 8. In the example illustrated in FIG. 13, the abrasion amount was 1.5 μm. Note that the magnification in measurement in FIG. 13 is 2000 times in the radial direction (the X-direction) and 1000 times in the axial direction (the Y-direction) of the cylinder 1 as in FIG. 8. It can be said, from the contour curve of the outer peripheral surface S of the segment 11, 12 after the measurement test, that there is no increase in oil consumption with an outer peripheral shape approximating that contour curve.

Further, in the case where the segment 11, 12 is the outer peripheral surface S in the second shape as illustrated in FIG. 9, when the length L4 in the axial direction of the flat part SF exceeds 0.05 mm, the contact area between the outer peripheral surface S of the segment 11, 12 and the inner wall surface of the cylinder 1 increases and the contact pressure of the segment 11, 12 due to its self tension to the inner wall surface of the cylinder 1 decreases, unfavorably causing an increase in oil consumption ratio. On the other hand, as in the above-described Table 1, when the length L4 is 0.05 mm or less, the oil consumption ratio does not increase, resulting in an excellent result.

<9. Effect and Operation>

According to the combination oil ring 10 in the above configuration, L is set to be 0.05 mm≤L≤0.15 mm as a range that is the prerequisite at the tip end part SA of the outer peripheral surface S in this embodiment, and additionally the asymmetrical region R2 exists in a range from the vertex part SP of the segment 11, 12 to at least 0.025 mm toward the inner peripheral side in the radial direction (the X-direction). In addition, under the condition that the surface roughness of the asymmetrical portion is 0.6 μmRp or less, when [Expression 1] of 0.05 mm≤L 0.15 mm, [Expression 2] of L1/L≥0.5, [Expression 3] of L3/L≤0.74, [Expression 4] of 2 degrees ≤θ1≤7 degrees, and [Expression 5] of 9 degrees ≤θ2 (in the case of the configuration as illustrated in FIG. 6) are satisfied, it is possible to reduce the oil consumption in the high-speed region.

Figure 14:
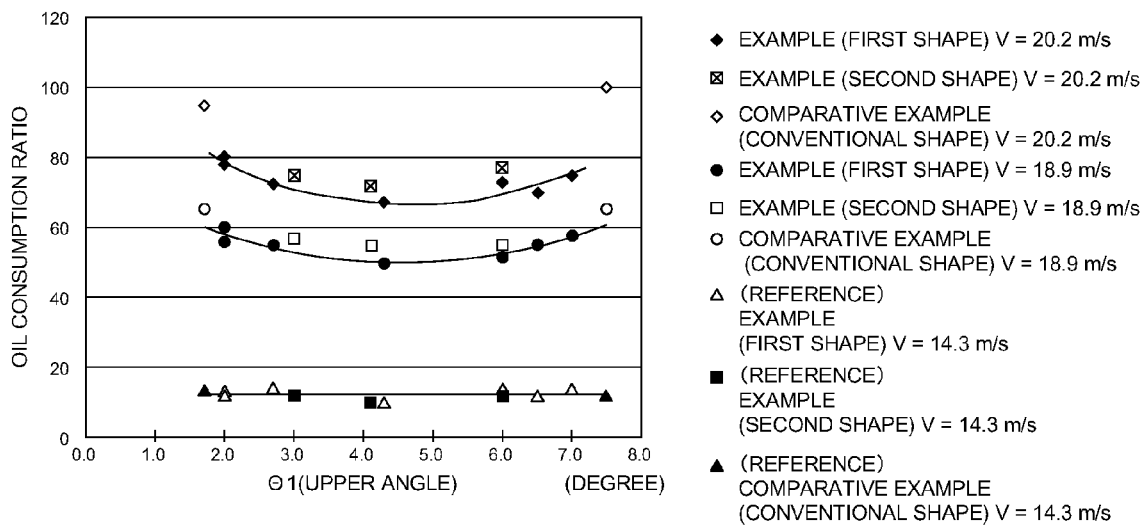
FIG. 14 is a graph relating to an oil consumption measurement result based on Table 1.

This appearance is illustrated in FIG. 14. FIG. 14 is a graph relating to an oil consumption measurement result based on Table 1. In FIG. 14, the horizontal axis indicates θ1 (the upper angle), and the vertical axis indicates the oil consumption ratio. Further, in FIG. 14, the oil consumption ratio using the segments 11, 12 having the outer peripheral surfaces S in the first shape as illustrated in FIG. 6 is indicated for each angle θ1, and black diamond-shaped points painted indicate the case of a mean piston speed of 20.2 m/s, and black circle points indicate the case of a mean piston speed of 18.9 m/s. Further, in FIG. 14, the oil consumption ratio when using the segments 11, 12 having the outer peripheral surfaces S in the second shape as illustrated in FIG. 9 is indicated for each angle θ1, and square points having crisscross therein indicate the case of a mean piston speed of 20.2 m/s, and void square points indicate the case of a mean piston speed of 18.9 m/s.

Note that FIG. 14 also indicates Comparative Examples. In FIG. 14, void diamond-shape points correspond to the case of the mean piston speed of 20.2 m/s, and indicate the angle θ1 in Comparative Example 1 of 7.5 degrees and the angle θ1 in Comparative Example 2 of 1.7 degrees respectively. Further, in FIG. 14, the void circle points correspond to the case of the mean piston speed of 18.7 m/s, and indicate the angle θ1 in Comparative Example 1 of 7.5 degrees and the angle θ1 in Comparative Example 2 of 1.7 degrees respectively.

Further, FIG. 14 also indicates the oil consumption when the mean piston speed is 14.3 m/s as a reference. Void triangle points correspond to the case of using the segments 11, 12 having the outer peripheral surfaces S in the first shape as illustrated in FIG. 6. Further, black square points correspond to the case using segments 11, 12 having the outer peripheral surfaces S in the second shape as illustrated in FIG. 9. Further, black triangle points correspond to the case of using the segments having the outer peripheral surfaces in Comparative Example being the conventional configuration. Note that in a region in which a mean piston speed was 14.3 m/s low in speed than the high-speed region, there was no difference observed in the oil consumption ratio between Comparative Examples and Examples (the first shape, the second shape).

Here, in FIG. 14, it is obvious that the oil consumption ratio is lower in the range of 2 degrees ≤θ1≤7 degrees of [Expression 4] than in Comparative Example 1 (the angle θ1=7.5 degrees) and Comparative Example 2 (the angle θ2=1.7 degrees) which are outside the above-described range. As concrete numerical values, in Examples 1 to 7 within the range of 2 degrees ≤θ1≤7 degrees of [Expression 4], in the high-speed region such as the case where the mean piston speed is 20.2 m/s and the case where it is 18.9 m/s, the oil consumption ratio can be reduced by about 15% or more.

Incidentally, at the present circumstances, to reduce the fuel consumption of the engine, reduction in tension of the oil ring is under progression for the purpose of reducing the friction. By the reduction in tension, the oil film thickness increases particularly in the high-speed region where the engine becomes high revolution, along with which the oil consumption increases particularly in the high-speed region. However, as is clear from Table 1 and FIG. 14, in the case where the surface roughness is 0.6 μmRp or less and [Expression 1] to [Expression 5] are satisfied, it becomes possible to reduce the oil consumption in the high-speed region.

Note that in the conventional segment, the shape of the outer peripheral surface S is grasped in a range in which the dimension in the radial direction is larger such that it is 15 μm toward the center of the radial direction. For example, FIG. 1, FIG. 2 in PTL 1 also illustrates the locus of the outer peripheral surface seemed to be measured in such a range. However, in this embodiment, the tip end part SA of the outer peripheral surface S in the shape finely defined in a narrower range such as 3 μm from the vertex part SP is provided as is clear from FIG. 6. Therefore, the scale of fineness of the viewed shape can be said to be completely different from the conventional configuration.

Further, as is clear from the disclosure of NPL 1, it is indicated that the oil film thickness when the oil ring is supplied to the test ranges from about 1 μm to 6 μm in four cycles on the thrust side under a full-load operation condition of 2000 rpm by the LIF (Laser-Induced-Fluorescence) method. In addition, the fact that the oil film thickness increases with an increase in the number of revolutions of the engine is described. Thus, in the high revolution region (the high-speed region) of the engine, when the fine shape of the outer peripheral surface S is defined in the range of 3 μm from the vertex part SP as in the segment 11, 12 in this embodiment, the improvement in performance of the oil consumption is considered to be greatly affected. Conversely, even if the shape of the outer peripheral surface S in a region of 10 μm or 15 μm toward the inner peripheral wall in the radial direction from the vertex part SP being a range exceeding the oil film thickness is finely defined, it cannot be expected to improve performance of the oil consumption, as compared with the case of defining the fine shape of the outer peripheral surface S in the range of 3 μm from the vertex part SP.

However, though there is mention about the oil film thickness in NPL 1 as described above, an effective outer peripheral surface S created by actually variously studying that what kind of shape of the outer peripheral surface S is actually effective to reduce the oil consumption in a range close to the oil film thickness, is not found at filing.

In contrast, in this embodiment, the contour shape of the outer peripheral surface S is finely defined in the range of 3 μm from the vertex part SP for the outer peripheral surface S, and the reduction of the oil consumption in the high-speed region is further actually verified. In this regard, this embodiment can be said to have an inventive step even if compared with any documents.

Further, in this embodiment, the angle θ1 of the outer peripheral surface S in the first shape as illustrated in FIG. 6 and the angle θ1 of the outer peripheral surface S in the second shape as illustrated in FIG. 9 preferably satisfy the condition of 3 degrees ≤θ1≤6 degrees of [Expression 6]. In this case, as is clear from Table 1 and FIG. 14, when the mean piston speed is 20.2 m/s, the oil consumption ratio can be decreased to be smaller than 80 in any case, and when the mean piston speed is 18.9 m/s, the oil consumption ratio can be decreased to be smaller than 60 in any case. In short, it becomes possible to further reduce the oil consumption in the high-speed region of the engine.

Further, in this embodiment, the flat part SF as illustrated in FIG. 9 is provided in the second contour section S2. Further, regarding the length L4 in the axial direction (the Y-direction) of the flat part SF, L4≤0.05 mm of [Expression 8] is satisfied, and the condition of L3/L≤0.76 of [Expression 7] is satisfied. Even in the case of having the outer peripheral surface S in the shape as illustrated in FIG. 9, it becomes possible to reduce the oil consumption in the high-speed region of the engine as is clear from Table 1 and FIG. 14.

Further, in this embodiment, the hard coating films 11a, 12a are formed on the outer peripheral surfaces S of the segments 11, 12, and the hard coating films 11a, 12a are one of the followings.

(6-1) A nitride coating film by the ion plating method, composed of a nitride of one element selected from among chromium and titanium.

(6-2) A nitride coating film by the ion plating method, composed of a nitride of one kind or two kinds selected from among chromium and titanium, and containing aluminum.

(6-3) A nitride coating film by the ion plating method of an element selected from among chromium and titanium solid-dissolving at least one element selected from among oxygen, carbon and boron.

(6-4) A nitride coating film by the ion plating method in which metal chromium solid-dissolving nitrogen and $Cr_2N$ mixedly exist.

(6-5) A DLC (amorphous carbon) coating film by the ion plating method using only carbon.

(6-6) A DLC (amorphous carbon) coating film by the ion plating method containing one kind or two or more kinds from among silicon, oxygen, hydrogen, tungsten, and titanium in addition to carbon.

(6-7) A coating film constituted by covering one of the DLC coating films of (6-5) and (6-6) on the outer periphery of the hard coating film of one of the nitride coating films of the above (6-1) to (6-4).

Further, regarding the above-described hard coating films 11a, 12a, the surface hardness of each of (6-1) to (6-7) is HV 1000 or more, and the thickness of each of the coating films of (6-1) to (6-6) is 3 μm, and the thickness of a plurality of layers of (6-7) is 3 μm or more.

When the hard coating films 11a, 12a are provided, it becomes possible to improve the abrasion resistance.

<10. Modified Example>

The embodiments of the present invention have been described above, but the present invention is variously modified in addition to them. Hereinafter, they will be described.

In the above embodiments, regarding the shape of the outer peripheral surface S, the contours of the first contour section S1 to the third contour section S3 have the curved shapes. However, linear portions may partially exist in the curved shapes.

The invention claimed is:

1. A combination oil ring installed in an oil ring groove of a piston for an internal combustion engine and comprising: a pair of segments having outer peripheral surfaces sliding on an inner wall of a cylinder;

and an expander spacer arranged between the pair of segments and pressing the outer peripheral surfaces of the pair of segments against the inner wall of the cylinder, wherein:

a shape of the outer peripheral surface in an arbitrary longitudinal section of the segment has, in a radial direction from each outer peripheral end portion of faces forming a segment width toward the inner wall of the cylinder, curved shapes symmetric while forming a pair on an engine combustion chamber side and on a side distant from an engine combustion chamber in the segment width direction, and the shape of the outer peripheral surface on a side of an outer peripheral vertex in contact with the inner wall when inserted into the cylinder has an asymmetrical shape in the segment width direction across a portion of the outer peripheral vertex, which is a shape continuous to the curved shapes;

the asymmetrical shape takes a first intermediate line passing through a center of the segment width;

at an outer peripheral tip end part where a contour curve of the outer peripheral surface in the segment longitudinal section is traced, of two positions on the contour curve corresponding to a position at a distance of 3μm from the outer peripheral vertex toward the inner peripheral side in the segment radial direction, a position on the engine combustion chamber side is a position a1 and a position on the side distant from the engine combustion chamber is a position b1;

when a length of a line segment between the position a1 and the position b1 is L and an intermediate line of the line segment of the length L is a second intermediate line, the second intermediate line is located on the side more distant from the engine combustion chamber than the first intermediate line, and the outer periphery vertex of the segment is located on the second intermediate line or on the side more distant from the engine combustion chamber than the second intermediate line;

the contour curve of the outer peripheral surface in the segment longitudinal section is traced from the outer peripheral vertex of the segment to at least 0.025 mm toward the inner peripheral side in the segment radial direction so that a symmetrical shape taking both end sides in an axial direction as a pair exists on inner peripheral side positions in the segment radial direction;

when the contour curve of the asymmetrical shape at the segment outer peripheral tip end part is sectioned into a curved portion sandwiched between the outer peripheral vertex and a distance of 1.5 µm from the outer peripheral vertex toward the inner peripheral side in the segment radial direction and a contour portion sandwiched between the distance of 1.5 µm and a distance of 3.0 µm from the outer peripheral vertex toward the inner peripheral side in the segment radial direction, a first contour section, a second contour section, and a third contour section are set from the engine combustion chamber side in the segment width direction;

the first contour section is provided to be a part of a linear shape or a part of a quadratic curve shape starting from a first end portion on the engine combustion chamber side of the second contour section;

the second contour section has the outer peripheral vertex at a intermediate thereof and is provided in an arc shape;

the third contour section is provided to be a part of a quadratic curve shape starting from a second end portion on the side distant from the engine combustion chamber of the second contour section;

a surface roughness of the asymmetrical portion of the segment outer peripheral surface is 0.6 µmRp or less;

a length on the position a1 side and a length on the position b1 side of the line segment L divided by a line in the radial direction orthogonal to a line segment between the position a1 and the position b1 of the outer peripheral tip end part in the contour curve and passing through the outer peripheral vertex, are L1 and L2 respectively;

further, when at two positions on the contour curve at the distance of 1.5 µm from the outer peripheral vertex toward the inner peripheral side in the segment radial direction, a position on the engine combustion chamber side is a position a2 and a position on the side distant from the engine combustion chamber is a position b2, and a length of a line segment between the position a2 and the position b2 is L3, conditions of 0.05 mm ≤L≤0.15 mm, L1/L≥0.5, and L3/L≤0.74 are satisfied;

when an angle formed between a first straight line passing through the position a1 and through the position a2 and the axial direction of the cylinder is an angle θ1, a condition of 2 degrees ≤θ1≤7 degrees is satisfied;

when an angle formed between a second straight line passing through the position b1 and through the position b2 and the axial direction of the cylinder is an angle θ2, a condition of 9 degrees ≤θ2 is satisfied; and the pair of segments are installed in the oil ring groove so that the respective outer periphery vertexes are located on the side distant from the engine combustion chamber.

2. The combination oil ring according to claim 1, wherein regarding the angle θ1, a condition of 3 degrees ≤θ1≤6 degrees is satisfied.

3. A combination oil ring installed in an oil ring groove of a piston for an internal combustion engine and comprising: a pair of segments having outer peripheral surfaces sliding on an inner wall of a cylinder; and an expander spacer arranged between the pair of segments and pressing the outer peripheral surfaces of the pair of segments against the inner wall of the cylinder, wherein:

a shape of the outer peripheral surface in an arbitrary longitudinal section of the segment has, in a radial direction from each outer peripheral end portion of faces forming a segment width toward the inner wall of the cylinder, curved shapes symmetric while forming a pair on an engine combustion chamber side and on a side distant from an engine combustion chamber in the segment width direction, and the shape of the outer peripheral surface on a side of an outer peripheral vertex in contact with the inner wall when inserted into the cylinder has an asymmetrical shape in the segment width direction across a portion of the outer peripheral vertex, which is a shape continuous to the curved shapes;

the asymmetrical shape takes a first intermediate line passing through a center of the segment width;

at an outer peripheral tip end part where a contour curve of the outer peripheral surface in the segment longitudinal section is traced, of two positions on the contour curve corresponding to a position at a distance of 3 µm from the outer peripheral vertex toward the inner peripheral side in the segment radial direction, a position on the engine combustion chamber side is a position a1 and a position on the side distant from the engine combustion chamber is a position b1;

when a length of a line segment between the position a1 and the position b1 is L and an intermediate line of the line segment of the length L is a second intermediate line, the second intermediate line is located on the side more distant from the engine combustion chamber than the first intermediate line, and the outer periphery vertex of the segment is located on the second intermediate line or on the side more distant from the engine combustion chamber than the second intermediate line;

the contour curve of the outer peripheral surface in the segment longitudinal section is traced from the outer peripheral vertex of the segment to at least 0.025 mm toward the inner peripheral side in the segment radial direction so that a symmetrical shape taking both end sides in an axial direction as a pair exists on inner peripheral side positions in the segment radial direction;

when the contour curve of the asymmetrical shape at the segment outer peripheral tip end part is sectioned into a curved portion sandwiched between the outer peripheral vertex and a distance of 1.5 µm from the outer peripheral vertex toward the inner peripheral side in the segment radial direction and a contour portion sandwiched between the distance of 1.5 µm and a distance of 3.0 µm from the outer peripheral vertex toward the inner peripheral side in the segment radial direction, a first contour section, a second contour section, and a third contour section are set from the engine combustion chamber side in the segment width direction;

the first contour section is provided to be a part of a linear shape or a part of a quadratic curve shape starting from a first end portion on the engine combustion chamber side of the second contour section;

the second contour section has a flat part at a intermediate thereof, and is provided in a shape composed of a part of a linear shape or a part of a quadratic curve shape from an end portion on the engine combustion chamber side in the axial direction of the flat part and continuous to the first contour section, and composed of a part of a quadratic curve shape from an end portion on the side distant from the engine combustion chamber in the axial direction of the flat part and continuous to the third contour section;

the third contour section is provided to be a part of a quadratic curve shape continuous to the second end portion;

a surface roughness of the asymmetrical portion of the segment outer peripheral surface is 0.6 μmRp or less;

a length on the position a1 side and a length on the position b1 side of the line segment L divided by a line in the radial direction orthogonal to a line segment between the position a1 and the position b1 of the outer peripheral tip end part in the contour curve of the segment outer peripheral surface and passing through the outer peripheral vertex, are L1 and L2 respectively;

further, when at two positions on the contour curve at the distance of 1.5 μm toward the inner peripheral side in the segment radial direction, a position on the engine combustion chamber side is a position a2 and a position on the side distant from the engine combustion chamber is a position b2, a length of a line segment between the position a2 and the position b2 is L3, and a length in the axial direction of the flat part in the second contour section is L4, conditions of 0.05 mm ≤L≤0.15 mm, L1/L≥0.5, L3/L≤0.76, and 0<L4≤0.05 mm are satisfied;

when an angle formed between a first straight line passing through the position a1 and through the position a2 and the axial direction of the cylinder is an angle θ1, a condition of 3 degrees ≤θ1≤6 degrees is satisfied; and when an angle formed between a second straight line passing through the position b1 and through the position b2 and the axial direction of the cylinder is an angle θ2, a condition of 9 degrees ≤θ2 is satisfied; and the pair of segments are installed in the oil ring groove so that the respective outer periphery vertexes are located on the side distant from the engine combustion chamber.

4. The combination oil ring according to claim 1, wherein:

the outer peripheral surface of the segment has one of coating films:

(1) a coating film by an ion plating method, composed of a nitride of one kind or two kinds selected from among chromium and titanium;

(2) a coating film by an ion plating method, composed of a nitride of one kind or two kinds selected from among chromium and titanium, and containing aluminum;

(3) the coating film by the ion plating method of (1) further solid-dissolving at least one element selected from among oxygen, carbon and boron;

(4) a coating film by an ion plating method in which metal chromium solid-dissolving nitrogen and $Cr_2N$ mixedly exist;

(5) a DLC (amorphous carbon) coating film by an ion plating method using only carbon;

(6) a DLC (amorphous carbon) coating film by an ion plating method containing one kind or two or more kinds of elements among silicon, oxygen, hydrogen, tungsten, and titanium in addition to carbon; and (7) a coating film constituted by covering any of the DLC coating film of the (5) and the DLC coating film of the (6) on any of the coating films of the (1), the (2), the (3), and the (4);

a surface hardness of each of the coating films from the coating film of the (1) to the (7) is HV 1000 or more; and a thickness of each of the coating films of the coating film of (1) to the (6) is 3 μm or more, and a thickness of a plurality of layers of the (7) is 3 μm or more.

5. The combination oil ring according to claim 2, wherein:

the outer peripheral surface of the segment has one of coating films:

(1) a coating film by an ion plating method, composed of a nitride of one kind or two kinds selected from among chromium and titanium;

(2) a coating film by an ion plating method, composed of a nitride of one kind or two kinds selected from among chromium and titanium, and containing aluminum;

(3) the coating film by the ion plating method of (1) further solid-dissolving at least one element selected from among oxygen, carbon and boron;

(4) a coating film by an ion plating method in which metal chromium solid-dissolving nitrogen and $Cr_2N$ mixedly exist;

(5) a DLC (amorphous carbon) coating film by an ion plating method using only carbon;

(6) a DLC (amorphous carbon) coating film by an ion plating method containing one kind or two or more kinds of elements among silicon, oxygen, hydrogen, tungsten, and titanium in addition to carbon; and (7) a coating film constituted by covering any of the DLC coating film of the (5) and the DLC coating film of the (6) on a hard coating film of any of the coating films of the (1), the (2), the (3), and the (4);

a surface hardness of each of the coating films from the coating film of the (1) to the (7) is HV 1000 or more; and a thickness of each of the coating films of the coating film of (1) to the (6) is 3 μm or more, and a thickness of a plurality of layers of the (7) is 3 μm or more.

6. The combination oil ring according to claim 3, wherein:

the outer peripheral surface of the segment has one of coating films:

(1) a coating film by an ion plating method, composed of a nitride of one kind or two kinds selected from among chromium and titanium;

(2) a coating film by an ion plating method, composed of a nitride of one kind or two kinds selected from among chromium and titanium, and containing aluminum;

(3) the coating film by the ion plating method of (1) further solid-dissolving at least one element selected from among oxygen, carbon and boron;

(4) a coating film by an ion plating method in which metal chromium solid-dissolving nitrogen and $Cr_2N$ mixedly exist;

(5) a DLC (amorphous carbon) coating film by an ion plating method using only carbon;

(6) a DLC (amorphous carbon) coating film by an ion plating method containing one kind or two or more kinds of elements among silicon, oxygen, hydrogen, tungsten, and titanium in addition to carbon; and (7) a coating film constituted by covering any of the DLC coating film of the (5) and the DLC coating film of the (6) on a hard coating film of any of the coating films of the (1), the (2), the (3), and the (4);

a surface hardness of each of the coating films from the coating film of the (1) to the (7) is HV 1000 or more; and a thickness of each of the coating films of the coating film of (1) to the (6) is 3μm or more, and a thickness of a plurality of layers of the (7) is 3μm or more.

* * * * *